United States Patent
Arezzo et al.

(10) Patent No.: US 6,335,053 B1
(45) Date of Patent: *Jan. 1, 2002

(54) PROCESS FOR THE CONTINUOUS PRODUCTION BY PHYSICAL PHASE VAPOR DEPOSITION OF COATED METALLIC BANDS HAVING A HIGH CORROSION RESISTANCE

(75) Inventors: Franco Arezzo; Pietro Gimondo; Gianni Speranza, all of Rome (IT)

(73) Assignee: Centro Sviluppo Materiali S.p.A., Rome (IT)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/062,699

(22) Filed: Apr. 20, 1998

(30) Foreign Application Priority Data

Apr. 18, 1997 (IT) ........................................ RM97A0227

(51) Int. Cl.⁷ .............................................. C23C 16/06
(52) U.S. Cl. ....................... 427/251; 427/250; 427/321; 427/328; 427/533; 427/593
(58) Field of Search ................................ 427/250, 251, 427/320, 321, 328, 533, 585, 587, 593, 436

(56) References Cited

U.S. PATENT DOCUMENTS

| 4,847,169 | A | * | 7/1989 | Sakai et al. ................. 428/659 |
| 5,616,362 | A | * | 4/1997 | Goldschmied et al. ....... 427/328 |
| 5,648,177 | A | * | 7/1997 | Fukui et al. ................. 428/610 |
| 5,651,839 | A | * | 7/1997 | Rauf ........................... 148/95 |
| 5,747,111 | A | * | 5/1998 | Fukui et al. ................. 427/250 |

OTHER PUBLICATIONS

1994 Derwent Info Ltd. Dialog, KR 9400085 (Jan. 5, 1994) Abstract, Jan. 1994.*

* cited by examiner

Primary Examiner—Shrive P. Beck
Assistant Examiner—Jennifer Calcagni
(74) Attorney, Agent, or Firm—Smith, Gambrell & Russell LLP

(57) ABSTRACT

A process for the continuous production of coated metallic bands obtained by physical phase vapor deposition includes the following steps carried out on a band, eventually coated with zinc or its alloys, in motion and maintained in a vacuum environment:

heating the band to be coated;

activating the band surface;

heat stabilizing the band;

depositing a zinc layer on the metallic band;

secondary heat stabilizing the band; and depositing one or more elements or compounds on the zinc layer, these elements being able to synergistically interact with the zinc layer to obtain high corrosion resistance, weldability, ductility, and adhesion.

7 Claims, 1 Drawing Sheet

PROCESS FOR THE CONTINUOUS PRODUCTION BY PHYSICAL PHASE VAPOR DEPOSITION OF COATED METALLIC BANDS HAVING A HIGH CORROSION RESISTANCE

BACKGROUND OF THE INVENTION

The present invention relates to a process for continuously coating metallic bands by physical phase vapor deposition (PVD), and particularly to a process which, by exploiting one or more technological variations of PVD, produces coated metallic bands having high corrosion resistance, adhesion, ductility and weldability features.

The present invention finds its application for the development of very high corrosion resistant coated metallic bands to be used in the automotive, household electrical apparatuses and appliances, and building fields.

Traditionally, metallic bands are coated by a hot dipping process into melt metallic baths or by an electrolytical process.

Dipping processes have the following drawbacks: the kind of coating is essentially limited to zinc or aluminum and their alloys, usually large coating thicknesses, and the formation of intermetallics between the coating and the steel substrate, thus causing brittleness of the same coating.

The electrolytical processes give a better product with respect to the dipping processes, but are limited to the material that can be dissolved into water solution. They have problems from an ecological point of view, connected with the disposal of the electrolytical baths, and finally, they require an electrical power consumption higher than the one required for the dipping process.

Besides the above mentioned processes, vacuum deposition technologies have been developed, such as the vapor phase chemical deposition (PVD) and physical phase vapor deposition (PVD).

By employing batch processes based on these technologies (PVD and PVD), different coatings have been realized, used for specific fields such as the mechanical, aeronautic and energetic fields.

PVD technology can be divided into four categories: evaporation, sputtering, ion plating, ion beam assisted deposition, each one of them comprising many variants.

Evaporation can use different sources, such as: electrical resistance, electronic beam, laser, electronic arc.

Known batch PVD evaporation plants generally employ only one kind of evaporation source, chosen on the basis of the material to be deposited.

Recently an object of the search has been focused on the conversion of batch processes to extend their applicability to the PVD technology to the coating of metallic bands.

It is known that PVD processes are presently under development to continuously coat metallic bands and to be able to confer to the obtained products high corrosion resistance features which have been limited to only zinc coating or aluminum coating.

However, singularly employing these materials in the PVD process, even if high evaporation rates are obtained (zinc reaches 50 $\mu$m/s while aluminum reaches 3 $\mu$m/s), produces products having corrosion resistance features comparable with those obtained by the conventional hot dipping electro-deposition processes.

Furthermore, it is known that PVD technology of the evaporation category that can be proposed for a continuous process, produces zinc layers on the steel bands having low adhesion due to the presence of an oxide layer on the band surface, which is difficult to remove compatibly with the high speed of the band during the process.

Therefore, there exist numerous needs not yet satisfied for the realization of a continuous PVD process on an industrial scale. Such needs include those of:

obtaining products having corrosion resistance features remarkably better than those that can be obtained by only zinc or aluminum coatings;

obtaining products having adhesion features remarkably better than those that can be obtained by only zinc or aluminum coatings;

having a solution to the incompatibility between the progress speed of the band to be coated in the known industrial lines and the deposition rate of the coating materials.

An object of the present invention is that of providing a process for the continuous production, by physical phase vapor deposition (PVD), of coated metallic bands having a high resistance to corrosion, weldability, ductility, and adhesion of the coating.

Furthermore, the present invention aims to overcome the problems connected with the traditional techniques and the known PVD continuous processes, in order to obtain products with improved corrosion resistance, weldability, ductility, and adhesion features, due to the synergy between the base element of the coating, zinc, and other elements or their compounds present in small quantities.

SUMMARY OF THE INVENTION

It is therefore a specific object of the present invention to provide a process for the continuous production of coated metallic bands, characterized in that the coated metallic bands are obtained by physical phase vapor deposition comprising the following steps carried out on a band, eventually coated with zinc or its alloys, in motion and maintained in a vacuum environment:

heating the band to be coated to a temperature included in the range between 250 and 500° C.;

eventual activation of the band surface;

heat stabilization of the band, to bring the same to a temperature included in the range between 100 and 250° C.;

eventual deposition of the zinc layer on the metallic band;

heat stabilization of the band, to bring the same to a temperature included in the range between 100 and 250° C.;

deposition on the zinc, or its alloys, a layer of one or more elements, or of their compounds, able to synergistically interact with the underlying zinc or its alloys layer in order to obtain high corrosion resistance, weldability, ductility and adhesion of the coating properties.

The band preferably advances at a rate between 10 and 200 m/min.

The activation of the not coated metallic band surface can be provided in the process according to the invention. This activation can be carried out by at least one or more of the pre-treatments chosen from the group comprising: electronic beam, mechanical brushing, ion bombing, and reducing atmosphere.

In preferred embodiments of the invention, the deposition on the metallic band of a zinc layer occurs by vaporization through electrical resistance or electronic beam.

The eventual thermal stabilization of the band can occur by heating, through employing an electronic beam or electric resistance, or by cooling with inert gas.

The deposition on the zinc layer or its alloys of one or more elements or their compounds can occur by vaporization by electronic beam.

The vacuum level under which the process is carried out can be included between $1\times10^{-3}$ and $60\times10^{-3}$ Pa.

The elements or their compounds to be used for the deposition on the zinc or its alloys layer, can be chosen from among the elements Al, Co, Cr, Cu, Fe, Mg, Mn, Mo, Ni, Pb, Si, Sn, Ti, Y, Zr or their compounds.

The amount of each of these elements or of their compounds into the zinc or its alloys layer is included between 0.2% and 3% in weight.

The deposition of the zinc layer on the metallic band can occur by vaporization creating a conical shaped vapor cloud having a diameter equal to or bigger than the width of the band and the height of the lower cone or equal to 30 cm.

The deposition of the zinc or its alloys layer can occur by vaporization of at least of one of the following elements: Al, Co, Cr, Cu, Fe, Mg, Mn, Mo, Ni, Pb, Si, Sn, Ti, Y, Zr or their compounds, creating a conical shaped vapor cloud with a diameter equal to or bigger than the width of the band and the height of the cone, between 30 and 60 cm.

For the deposition of one of the following elements: Al, Co, Cr, Cu, Fe, Mg, Mn, Mo, Ni, Pb, Si, Sn, Ti, Y, Zr or their compounds on the zinc or its alloys, an electronic beam having a power between 20 and 1500 kW can be used.

The zinc layer deposited on the band by physical phase vapor deposition, or the zinc or its alloys layer deposited by electro-deposition or hot dipping, is at least equal to 0.5 mm.

The present invention also relates to the coated band that can be obtained by the process described above.

BRIEF DESCRIPTION OF THE DRAWINGS

The invention will be further illustrated with the help of the enclosed figures.

DETAILED DESCRIPTION OF THE INVENTION

Searches carried out by the inventors have allowed further disclosure of the following aspects concerning the present invention.

The application of the PVD process according to the present invention is different in function, dependent upon whether the substrate is (1) comprised of a metallic band as such, or (2) of a metallic band previously coated with zinc or its alloys by a conventional technique.

Figure 1:
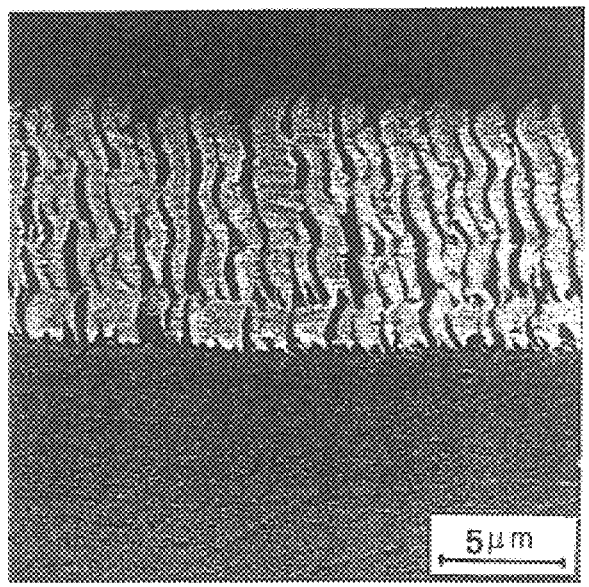
FIG. 1 shows a micrograph obtained by an electron microscope scan of a transverse section of the zinc coating deposited by PVD.

In the first case, the surface of the band after the heating step (400–500° C.) must be activated and thermally stabilized in such a way to allow an opened columnar kind growth of the zinc. In FIG. 1, a transverse section micrograph of the open columnar kind of structure of the zinc coating is shown. The open structure can be compacted by the addition of elements or their compounds which diffuse through the zinc layer, transversely, and interact between one column and another of the same.

Figure 2:
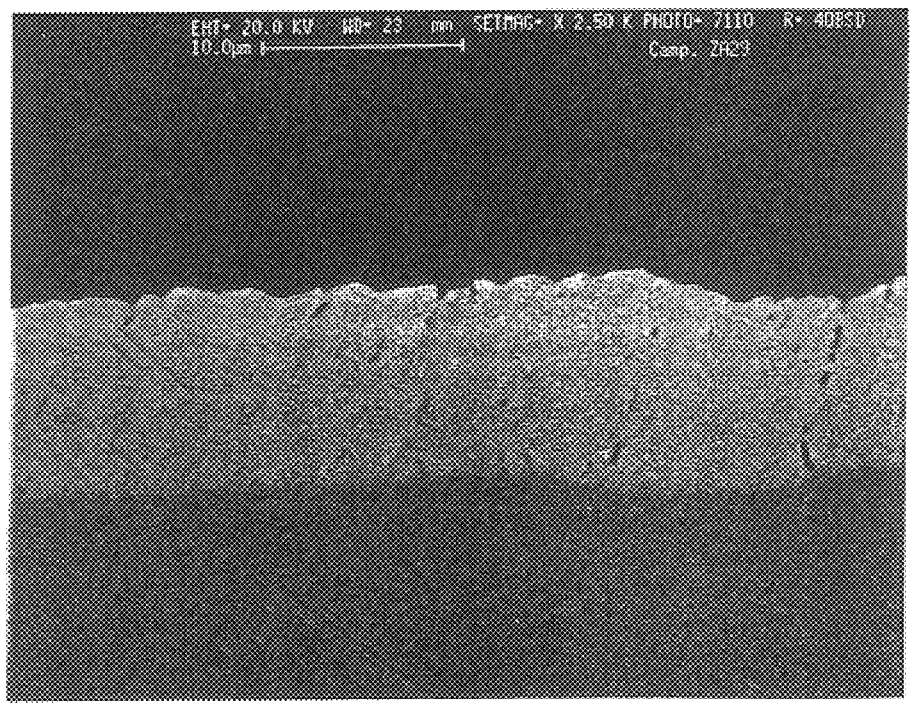
FIG. 2 shows a micrograph obtained by an electron microscope scan of a transverse section of the zinc coating deposited by PVD, compacted by adding aluminum.

FIG. 2 shows a transverse section micrograph of the same zinc layer of FIG. 1 by the addition of aluminum.

In the second case, where the band is already coated with zinc or its alloys, after the heating step (250–270° C.), the surface must be thermally stabilized in such a way to promote a chemical bonding reaction between the underlying zinc based layer and the added elements or compounds.

The eventual activation of the not coated band surface is useful to improve the adhesion of the zinc to the same, and is realized by the following pre-treatments used by themselves or as a combination: bombing by electronic beam or ion beam, under vacuum mechanical brushing, or reducing atmosphere.

The band is thermally stabilized, bringing it to a suitable temperature to receive the zinc coating.

The zinc layer is deposited by a PVD evaporation process, for example by electrical resistance or electronic gun, and employing into the same deposition chamber, or into different deposition chambers provided with band deflexion rolls, at least a crucible (for example graphite) for each chamber, placed in such a way that the distance between the surface of the material to be evaporated and the band surface is equal to or lower than 30 cm and in such position to allow also the coating of both the band sides.

Concerning the thermal stabilization of the band, it must be distinguished whether it is a band coated with zinc by PVD or if it is zinc or its alloys employing traditional techniques.

In the first case, for the proper realization of the method according to the present invention, it is suitable for the temperature of the band surface, at the beginning of the deposition of the elements or their additive compounds, to be between 100 and 140° C. This is useful to obtain the necessary compromise between condensation of the evaporating and their following diffusion through the zinc layer, minimizing the consumption of the same.

In the second case, it is suitable that the temperature of the band surface at the beginning of the deposition of the additive elements or their compounds, to be between 140 and 250° C. This is useful because it promotes a chemical bonding reaction between the additive elements or their compounds and the zinc or its alloys underlying the layer.

The elements or their compounds layer is deposited by a PVD evaporation process, for example by electronic beam, and employing within the same or within different deposition chambers provided with band deflexion rolls, at least a crucible (e.g. a water cooled copper crucible or a ceramic crucible) for each chamber placed in such a way that the distance between the surface of the material to be evaporated and the band surface is included in the range between 30 and 60 mm, and in such position to allow the coating of both the band sides.

The present invention further aims, by the addition of at least one of the following elements: Al, Co, Cr, Cu, Fe, Mg, Mn, Mo, Ni, Pb, Si, Sn, Ti, Y, or Zr or their compounds, to solve the problems connected with the low adhesion of the zinc layer deposited by PVD on the steel metallic band. The opened columnar structure of the zinc layer suitably created allows the diffusion of at least one or more additive elements or compounds and the consequent interaction with the same zinc, and in some cases with the interface by the controlled formation of intermetallics.

Finally, the present invention aims, by the addition of at least one the following elements: Al, Co, Cr, Cu, Fe, Mg, Mn, Mo, Ni, Pb, Si, Sn, Ti, Y, or Zr or their compounds, to confer a weldability higher than that of traditional zinc based products, zinc alloys included.

In the preceding, a general description of the present invention has been provided. By the help of the following examples, a detailed description of its embodiments will be provided, embodiments aimed to a better understanding of its objects, features, advantages and operative modes.

EXAMPLE 1

Zinc and Aluminum Deposition by the Process According to the Present Invention on a Metallic Band as Such.

In this example, a metallic band as such, after the conventional electrolytical cleaning step, is introduced at a rate of 20 m/min into a vacuum environment, with a pressure of $20 \times 10^{-3}$ Pa, during which the process according to the invention is realized.

The heating of the band is carried out at a temperature of about 480° C. for the removal of physically absorbed substances such as steam and solvent residuals.

Then the activation step is carried out, this step comprising the heating of the band up to about 600° C. within a nitrogen and hydrogen reducing atmosphere, following by a bombing with argon ion.

In this case, the thermal stabilization provides a cooling of the band to bring it to a temperature of about 120° C., the temperature at which the deposition of the zinc from a graphite crucible heated by electric resistance begins, the crucible being placed in such a way that the surface of the zinc layer is at a distance of 2.5 cm from the surface of the band to be coated.

After the completion of the zinc deposition, the thermal deposition of the band is carried out to bring it to a temperature of 130° C., the temperature at which the deposition of the aluminum from a ceramic crucible begins, the crucible being placed in such a way that the surface of the aluminum layer surface to be evaporated is at a distance of 30 cm from the surface of the band to be coated.

In this case the power of the electronic gun is 80 kW and the amount of deposited aluminum is 2.3% in weight of the coating, the remainder being zinc.

Samples obtained according to the method of example 1, having a total thickness of 11 mm, have been compared with zinc coatings obtained by traditional processes, either hot dipping processes or electrolytical processes, during corrosion resistance tests carried out according to the method described in the ASTM B117 rule.

Samples according to example 1 showed the appearance of red rust after 256 hours. During the same ASTM test, electro-zinc plated samples having a thickness of 10 mm and galvanized with a thickness of 20 mm, showed the appearance of red rust respectively after 100 and 240 hours.

Adhesion tests carried out according to the ASTM A525 M -87 rule all gave positive results, all of them showing an optimal adhesion of the coating to the substrate.

Spot weldability tests showed an easy weldability of the coating (good melting and penetration) and an electric power consumption lower than that necessary for the reference electro-zinc plated and galvanized products.

EXAMPLE 2

Aluminum Deposition by the Process According to the Present Invention on a Zinc Plated Metallic Band by Traditional Processes In this example, a zinc plated metallic band, produced by a hot dipping process, after the conventional electrolytical cleaning step, is introduced at a rate of 20 m/min under a vacuum environment, with a pressure of $20 \times 10^{-3}$ Pa, during which the process according to the invention is realized.

The heating of the band is carried out at a temperature of about 250° C. for the removal of physically absorbed substances such as steam and solvent residuals.

Then a thermal stabilization step is carried out, this step comprising a cooling of the band to bring it to a temperature of about 200° C., the temperature at which the deposition of the aluminum from a ceramic crucible begins, the crucible being placed in such a way that the surface of the aluminum layer surface to be evaporated is at a distance of 30 cm from the surface of the band to be coated.

In this case the power of the electronic gun is 80 kW and the amount of deposited aluminum is 1.2% in weight of the coating, the remainder being zinc.

Samples obtained according to the method described in example 2, having a total thickness of 10 mm, have been compared with zinc coatings obtained by traditional processes, either hot dipping processes or electrolytical processes, during corrosion resistance tests carried out according to the method described in the ASTM B117 rule.

Samples according to example 2 showed the appearance of red rust after 300 hours. During the same ASTM test, electro-zinc plated samples having a thickness of 10 mm and galvanized with a thickness of 20 mm, showed the appearance of red rust respectively after 120 and 260 hours.

Adhesion tests carried out according to the ASTM A 525 M -87 gave all positive results, all of them showing an optimal adhesion of the coating to the substrate.

Spot weldability tests showed an easy weldability of the coating (good melting and penetration) and an electric power consumption lower than that necessary for the reference electro-zinc plated and galvanized products.

What is claimed is:

1. A process for the continuous production of coated metallic bands obtained by physical phase vapor deposition comprising the following steps carried out on a band in motion and maintained in a vacuum environment:

heating the band to be coated to a temperature in the range between 250 and 500° C.;

activating the band surface;

thermally stabilizing the band, to bring it to a temperature in the range between 100 and 250° C.;

depositing a zinc or a zinc alloy layer having a plurality of voids onto the band;

thermally stabilizing the band, to bring it to a temperature in the range between 100 and 250° C.; and depositing one or more elements or their compounds onto the layer so that at least some of the voids are filled to obtain the properties of high corrosion resistance, weldability, ductility and adhesion of the coating, wherein the vacuum level in said environment is between $1 \times 10^{-3}$ and $60 \times 10^{-3}$ Pa.

2. The process according to claim 1, wherein the activation of the not coated metallic band surface occurs by a pre-treatments chosen from the group consisting of electronic beam, mechanical brushing, ion bombing, reducing atmosphere and combinations thereof.

3. The process according to claim 1, wherein the deposition on the metallic band of a zinc layer occurs by vaporization, electric resistance or electronic beam.

4. The process according to claim 2, wherein the deposition on the metallic band of a zinc layer occurs by vaporization, electric resistance or electronic beam.

5. The process according to claim 1, wherein the thermal stabilization of the band occurs by heating employing an electronic beam or electric resistance, of by cooling with inert gas.

6. A coated band obtained by the process according to claim 1.

7. The process according to claim 1, wherein the band moves at a rate between 10 and 200 m/min.

\* \* \* \* \*